(12) United States Patent
Hai (10) Patent No.: US 11,895,898 B2
(45) Date of Patent: Feb. 6, 2024

(54) DISPLAY PANEL AND DISPLAY EQUIPMENT

(71) Applicant: BOE Technology Group Co., Ltd., Beijing (CN)

(72) Inventor: Xiaoquan Hai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/264,143

(22) PCT Filed: May 28, 2020

(86) PCT No.: PCT/CN2020/093030
§ 371 (c)(1),
(2) Date: Jan. 28, 2021

(87) PCT Pub. No.: WO2021/217770
PCT Pub. Date: Nov. 4, 2021

(65) Prior Publication Data
US 2022/0114831 A1 Apr. 14, 2022

(30) Foreign Application Priority Data
Apr. 27, 2020 (WO) ................ PCT/CN2008/087170

(51) Int. Cl.
*G06V 40/13* (2022.01)
*G06F 3/041* (2006.01)
(Continued)

(52) U.S. Cl.
CPC ........... *H10K 59/60* (2023.02); *G06F 3/0412* (2013.01); *G06F 3/0443* (2019.05);
(Continued)

(58) Field of Classification Search
CPC ............................. G06V 10/17; G06V 10/147
See application file for complete search history.

(56) References Cited

U.S. PATENT DOCUMENTS

2012/0200506 A1 8/2012 Taylor et al.
2012/0256089 A1 10/2012 Kanda et al.
(Continued)

FOREIGN PATENT DOCUMENTS

CN 102727212 A 10/2012
CN 108288681 A 7/2018
(Continued)

OTHER PUBLICATIONS

Office Action for European Application No. 20920750.5 dated May 25, 2023.
(Continued)

*Primary Examiner* — Lixi C Simpson
(74) *Attorney, Agent, or Firm* — ArentFox Schiff LLP; Michael Fainberg (57) ABSTRACT

A display panel and a display equipment. The display panel includes a base substrate; a plurality of light emitting devices disposed on the base substrate; a plurality of photosensitive devices disposed on the base substrate, an orthographic projection of each photosensitive device on the base substrate being disposed at a gap of orthographic projections of the adjacent light emitting devices on the base substrate; and a plurality of light shading parts disposed on one side, facing away from the base substrate, of a layer where the light emitting devices are disposed, wherein the light shading parts are in one-to-one correspondence with the photosensitive devices, and an orthographic projection of each light shading part on the base substrate is at least partially overlapped with the orthographic projection of the corresponding photosensitive device on the base substrate.

11 Claims, 10 Drawing Sheets

(51) Int. Cl.
  *G06F 3/042* (2006.01)
  *H10K 59/126* (2023.01)
  *H10K 59/60* (2023.01)
  *G06F 3/044* (2006.01)
  *H10K 50/86* (2023.01)
  *H10K 59/35* (2023.01)
  *H10K 59/65* (2023.01)

(52) U.S. Cl.
  CPC ........ *G06F 3/0446* (2019.05); *G06V 40/1318* (2022.01); *H10K 50/865* (2023.02); *H10K 59/126* (2023.02); *G06F 2203/04107* (2013.01); *H10K 59/35* (2023.02); *H10K 59/65* (2023.02)

(56) References Cited

U.S. PATENT DOCUMENTS

| | | | |
|---|---|---|---|
| 2014/0299879 A1 | 10/2014 | Yamazaki | |
| 2018/0019288 A1* | 1/2018 | Yang | G06V 40/1318 |
| 2018/0196985 A1* | 7/2018 | Ling | G06V 40/1318 |
| 2019/0172887 A1 | 6/2019 | Sun et al. | |
| 2019/0213379 A1 | 7/2019 | Zhao et al. | |
| 2019/0237521 A1 | 8/2019 | Ju | |
| 2020/0105841 A1* | 4/2020 | Bang | H01L 27/14678 |
| 2020/0024319 A1 | 7/2020 | Zeng et al. | |
| 2020/0343477 A1 | 10/2020 | Zeng et al. | |
| 2020/0349334 A1 | 11/2020 | Li et al. | |
| 2020/0379602 A1 | 12/2020 | Zeng et al. | |
| 2021/0004556 A1 | 1/2021 | Reinhold et al. | |
| 2021/0036035 A1* | 2/2021 | Chang | H01L 27/14605 |
| 2021/0043692 A1 | 2/2021 | Cha et al. | |
| 2021/0056905 A1 | 2/2021 | Liu et al. | |
| 2021/0134866 A1* | 5/2021 | Chen | G02F 1/136209 |
| 2021/0134896 A1 | 5/2021 | Guo et al. | |
| 2021/0233975 A1 | 7/2021 | Bouthinon et al. | |

FOREIGN PATENT DOCUMENTS

| | | | |
|---|---|---|---|
| CN | 108598111 A | | 9/2018 |
| CN | 108615746 A | * | 10/2018 |
| CN | 109215604 A | | 1/2019 |
| CN | 109784303 A | | 5/2019 |
| CN | 109801946 A | | 5/2019 |
| CN | 110061042 A | | 7/2019 |
| CN | 110188702 A | | 8/2019 |
| CN | 110444158 A | | 11/2019 |
| CN | 110678983 A | | 1/2020 |
| CN | 110970475 A | | 4/2020 |
| WO | 2019205592 A1 | | 10/2019 |

OTHER PUBLICATIONS

Restriction Requirement for U.S. Appl. No. 17/425,898 dated Jul. 10, 2023.
Extended European Search Report in EP20900723.6, dated Sep. 21, 2023, 8 pages.
Final Office Action in U.S. Appl. No. 17/425,898, dated Nov. 16, 2023, 20 pages.
Non-Final Office Action in U.S. Appl. No. 17/425,898, dated Sep. 7, 2023, 37 pages.

* cited by examiner

DISPLAY PANEL AND DISPLAY EQUIPMENT

This application is a National Stage of International Application No. PCT/CN2020/093030, filed May 28, 2020, which claims priority to International Application No. PCT/CN2020/087170, filed Apr. 27, 2020, both of which are hereby incorporated by reference in their entireties.

FIELD

The present disclosure relates to the technical field of display, in particular to a display panel and display equipment.

BACKGROUND

With continuous development of a terminal technology, electronic devices are more and more widely used. In order to protect the user's information security, the use of fingerprint recognition functions on electronic devices is becoming more and more common, such as mobile phone unlocking, and mobile payments (such as payment, transfer).

An Organic Light Emitting Diode (OLED), as a current type light emitting device, has the advantages of self-luminescence, fast response and a wide viewing angle, can be manufactured in flexible products and the like, thereby being widely used in the field of high-performance displays. An OLED display screen with an optical fingerprint recognition function in the related art uses all regions in an effective display region (A-A region) as an optical fingerprint recognition region, and uses the light emitted by the OLED display screen itself as a light source for optical fingerprint recognition. Specifically, the self-luminous light is reflected by fingers above the display screen and then returns to the display screen and is transmitted to a photosensitive device. The photosensitive device generates different electrical signals according to the difference in the light reflection intensity of the fingerprint ridge and the fingerprint valley to realize fingerprint recognition.

SUMMARY

An embodiment of the present disclosure provides a display panel, including:

a base substrate;

a plurality of light emitting devices disposed on the base substrate;

a plurality of photosensitive devices disposed on the base substrate, wherein an orthographic projection of each photosensitive device on the base substrate is disposed at a gap of orthographic projections of adjacent light emitting devices on the base substrate; and a plurality of light shading parts disposed on a side, facing away from the base substrate, of a layer where the light emitting devices are disposed, wherein the light shading parts are in one-to-one correspondence with the photosensitive devices, and orthographic projections of the light shading parts on the base substrate are at least partially overlapped with orthographic projections of corresponding photosensitive devices on the base substrate.

Optionally, in the above-described display panel provided by some embodiments of the present disclosure, the orthographic projections of the light shading parts on the base substrate are disposed within the orthographic projections of the corresponding photosensitive devices on the base substrate.

Optionally, in the above-described display panel provided by some embodiments of the present disclosure, a shape of the orthographic projections of the light shading part on the base substrate is similar to a shape of the orthographic projections of the corresponding photosensitive device on the base substrate, and centers of shapes coincide with each other.

Optionally, in the above-described display panel provided by some embodiments of the present disclosure, the shape of the orthographic projections of the light shading parts on the base substrate is rectangular, and a side length of the orthographic projections of the light shading parts on the base substrate is less than or equal to ½ of a side length of the orthographic projections of the corresponding photosensitive devices on the base substrate.

Optionally, in the above-described display panel provided by some embodiments of the present disclosure, the side length of the orthographic projections of the light shading parts on the base substrate is equal to ⅓ of the side length of the orthographic projections of the corresponding photosensitive devices on the base substrate.

Optionally, in the above-described display panel provided by some embodiments of the present disclosure, the shape of the orthographic projection of the photosensitive devices on the base substrate is square, and a side length of the square is greater than or equal to 10 µm and less than or equal to 20 µm.

Optionally, in the above-described display panel provided by some embodiments of the present disclosure, the photosensitive devices are disposed between the layer where the light emitting devices are disposed and the base substrate.

Optionally, in the above-described display panel provided by some embodiments of the present disclosure, the base substrate includes a plurality of fingerprint recognition regions disposed in an array; and each of the fingerprint recognition regions includes at least two photosensitive devices, and the photosensitive devices in each of the fingerprint recognition regions are rotationally symmetrically distributed relative to a center of the fingerprint recognition region where the photosensitive devices are disposed.

Optionally, in the above-described display panel provided by some embodiments of the present disclosure, numbers of the photosensitive devices in rows are different within a same fingerprint recognition region, and a sum of lengths of the photosensitive devices is twice a sum of widths of the photosensitive devices.

Optionally, in the above-described display panel provided by some embodiments of the present disclosure, numbers of the photosensitive devices in rows are same within a same fingerprint recognition region, and shapes of every two photosensitive devices symmetrical with respect to the center of the fingerprint recognition region are the same.

Optionally, in the above-described display panel provided by some embodiments of the present disclosure, the display panel further includes: an encapsulation layer disposed between the layer where the light emitting devices are disposed and a layer where the light shading parts are disposed.

Optionally, in the above-described display panel provided by some embodiments of the present disclosure, the display panel further includes: a touch electrode layer disposed on a side, facing away from the base substrate, of the layer where the light shading parts are disposed.

Optionally, in the above-described display panel provided by some embodiments of the present disclosure, the light emitting devices include anodes, and the display panel further includes: a plurality of bias lines disposed on a same layer as the anodes; and each bias line is correspondingly and electrically connected with the photosensitive devices contained in corresponding row of the fingerprint recognition regions.

Optionally, in the above-described display panel provided by some embodiments of the present disclosure, the display panel further includes: a plurality of first transistors and a plurality of second transistors disposed between the base substrate and a layer where the photosensitive devices are disposed; and the first transistors are electrically connected with corresponding light emitting devices in a one-to-one correspondence manner, the second transistors are electrically connected with corresponding photosensitive devices in a one-to-one correspondence manner, and film layers of the first transistors and film layers of the corresponding second transistors are disposed on same layers.

Based on the same inventive concept, an embodiment of the present disclosure also provides a display equipment, including the display panel.

DETAILED DESCRIPTION OF THE EMBODIMENTS

In order to make objectives, technical solutions and advantages of the embodiments of the present disclosure more clear, the technical solutions of the embodiments of the present disclosure are described clearly and thoroughly with reference to the accompanying drawings of the embodiments of the present disclosure hereinafter. The thicknesses and shapes of various film layers in the accompanying drawings are not to reflect the true scale and are intended to be merely illustrative of the present disclosure. It is to be understood that the described embodiments are some, but not all, embodiments of the present disclosure. Based on the described embodiments of the present disclosure, all other embodiments attainable by those of ordinary skill in the art without creative work are within the scope of the present disclosure.

Unless defined otherwise, technical or scientific terms used herein shall have the ordinary meaning as understood by those of ordinary skill in the art to which the present disclosure belongs. The terms "first", "second", and similar referents used in the specification and claim of the present disclosure do not denote any order, quantity, or importance, but rather are used solely to distinguish one from another. The word "include" or "comprise", and the like, means that an element or article that precedes the word is inclusive of the element or article listed after the word and equivalents thereof, but does not exclude other elements or articles. The terms "inner", "outer", "upper", "lower", and the like are used merely to denote a relative positional relationship that may change accordingly when the absolute position of the object being described changes.

In the process of fingerprint recognition, besides the signal light emitted by sub-pixels can be sensed by photosensitive devices, ambient light emitted by fingers or the like can also be sensed by the photosensitive devices. As the light receiving of the photosensitive devices is passive, the light emitted by the sub-pixels cannot be actively distinguished from the ambient light, the ambient light may interfere with fingerprint recognition of the photosensitive devices, so texture imaging is blurred and even cannot be achieved.

Figure 1:
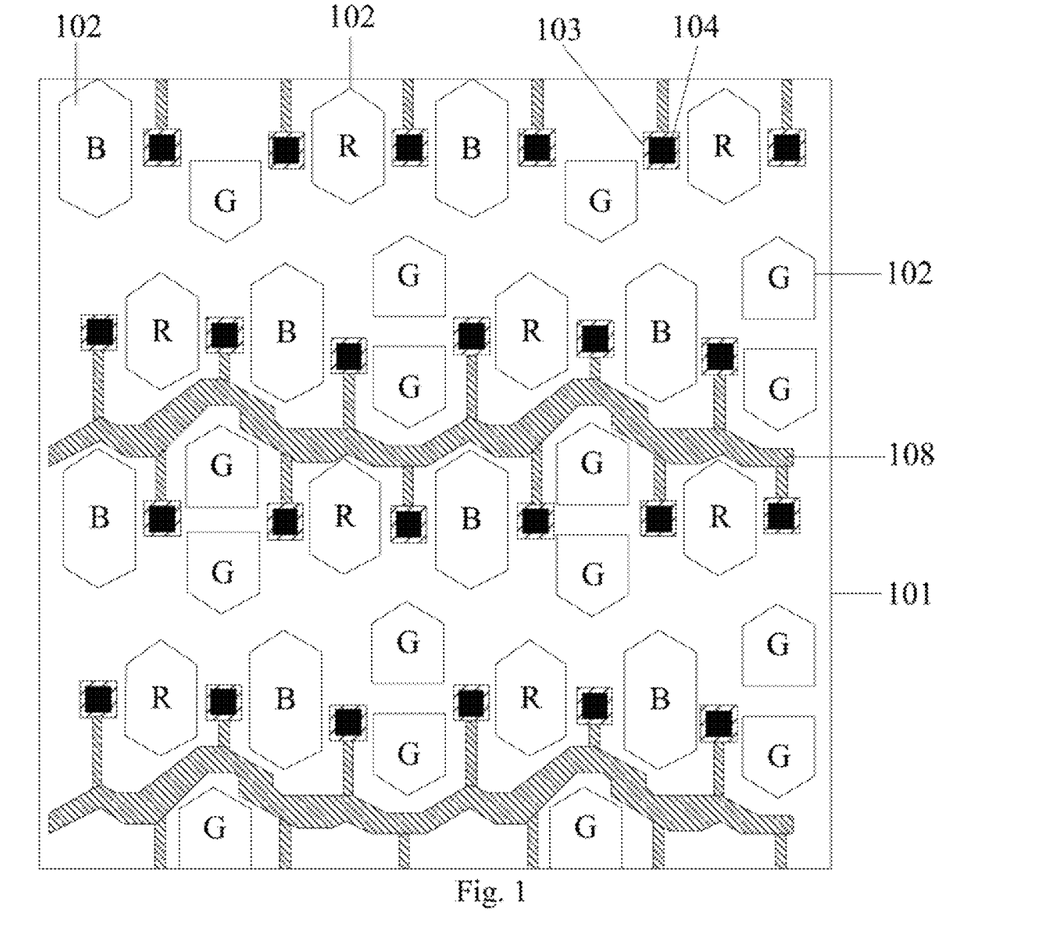
FIG. 1 is a plane structural schematic diagram of a display panel according to an embodiment of the present disclosure.
Figure 2:
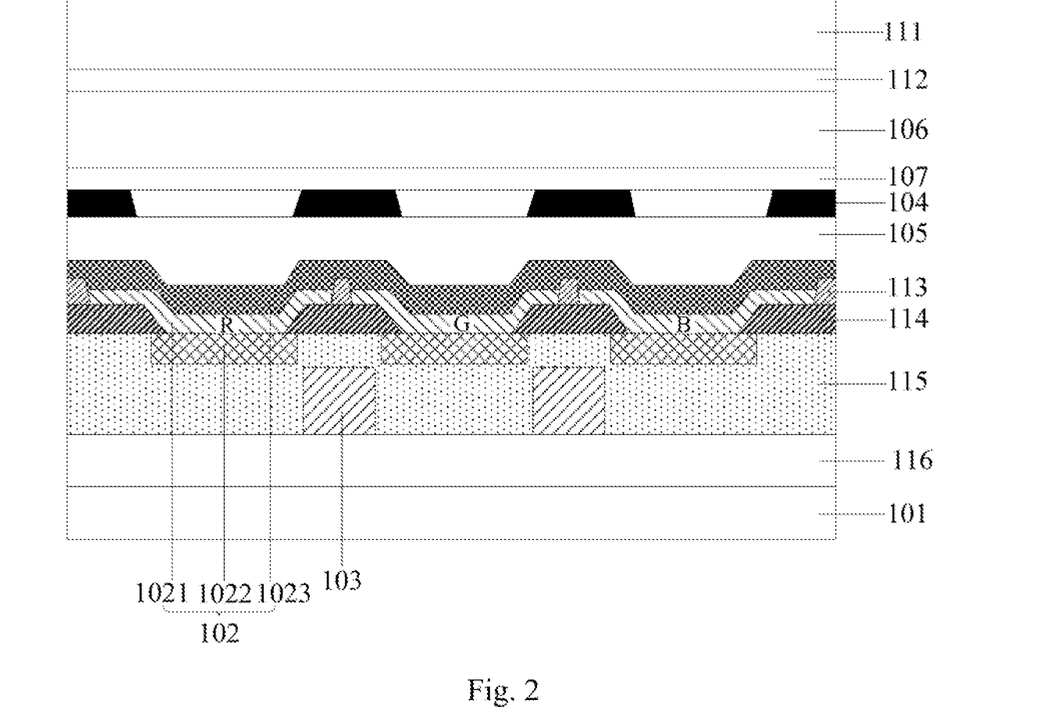
FIG. 2 is a sectional structural schematic diagram of a fingerprint recognition region according to an embodiment of the present disclosure.

Aiming at the problems in the related art, an embodiment of the present disclosure provides a display panel, as shown in FIG. 1 and FIG. 2, including:

a base substrate 101;

a plurality of light emitting devices 102 disposed on the base substrate 101;

a plurality of photosensitive devices 103 disposed on the base substrate 101, wherein an orthographic projection of each photosensitive device 103 on the base substrate 101 is disposed at a gap of orthographic projections of the adjacent light emitting devices 102 on the base substrate 101; and a plurality of light shading parts 104 disposed on one side, facing away from the base substrate 101, of a layer where the light emitting devices 102 are disposed, wherein the light shading parts 104 are in one-to-one correspondence with the photosensitive devices 103, and an orthographic projection of each light shading part 104 on the base substrate 101 is at least partially overlapped with the orthographic projection of the corresponding photosensitive device 103 on the base substrate 101.

In the display panel provided by some embodiments of the present disclosure, external ambient light is shaded by arranging the light shading parts 104 at least partially overlapped with the photosensitive devices 103, so that the ambient light is prevented from being irradiated to the photosensitive devices 103 to a certain extent, so that most of light received by the photosensitive devices 103 is signal light, the influence of the ambient light on the signal light is effectively avoided, and an optical signal-to-noise ratio (SNR) is improved.

It should be understood that since the light shading parts 104 are disposed on light emitting sides of the light emitting devices 102, in order to prevent the light shading parts 104 from affecting the picture display, it may be provided that regions, corresponding to the light emitting devices 102, in a layer where the light shading parts 104 are disposed are provided with openings. In addition, the light shading parts 104 may be made of a black resin such as a black matrix (BM) material, a black photoresist (SU8) material, a black pixel defining layer (PDL) material, or the like, and the openings may be made by using a photoetching process or a nanoimprint process.

It should be noted that in the process of fingerprint recognition, when light emitted by a point light source is irradiated to a fingerprint press interface (e.g., an outer surface of a display screen) at different angles, a part (namely 42°-70°) with an incidence angle of the light greater than or equal to a critical angle of total reflection (generally, a critical angle of total reflection between the display equipment and air is about 42°, and the maximum exit angle of the point light source is 70°) is totally reflected due to the total reflection of the fingerprint press interface, so that this part of light cannot exit from the fingerprint press interface, and a total reflection region is produced. Accordingly, a part with an incidence angle of the light less than the critical angle, namely 42°, of the total reflection exits from the fingerprint press interface. Therefore, the texture image acquisition can be performed by the light reflected by the total reflection region. Specifically, when a fingerprint of a user's finger is pressed to the total reflection region, the ridges of the fingerprint touch the surface of the total reflection region, so that a total reflection condition of the positions corresponding to the ridges of the fingerprint is destroyed, therefore light will exit at the corresponding positions, and an original reflection path is changed; however, the valleys of the fingerprint do not touch the surface of the total reflection region, so that a total reflection condition at the positions corresponding to the valleys of the fingerprint is not destroyed, the light will still be totally reflected at the corresponding positions, and the original reflection path is not changed. In this way, as for light rays in the total refection region, due to the different effects of the valleys and ridges of the fingerprint on the total reflection condition, the light incident on a fingerprint imaging interface forms alternately dark and bright texture images at different positions.

Optionally, in the above-described display panel provided by an embodiment of the present disclosure, as shown in FIG. 1, orthographic projections of the light shading parts 104 on the base substrate 101 are disposed within the orthographic projections of the corresponding photosensitive devices 103 on the base substrate 101.

From the above, it can be seen that light rays with an exit angle of 42°-70° among exit light rays of the point light source belong to an effective imaging range of fingerprint recognition, and therefore, in order to avoid that signal light in the range cannot be irradiated to the photosensitive devices 103 because the light shading parts 104 are too large after being reflected by the finger, the orthographic projections of the light shading parts 104 on the base substrate 101 need to be disposed within the orthographic projections of the corresponding photosensitive devices 103 on the base substrate 101.

Optionally, shapes of the orthographic projections of the light shading parts 104 on the base substrate 101 and shapes of the orthographic projections of the photosensitive devices 103 on the base substrate 101 are diverse, and may be, for example, rectangular (including square), trapezoidal, polygonal, or the like. For ease of understanding, in the present disclosure, a size relationship between the photosensitive devices 103 and the light shading parts 104 is described with the case where the shapes of the orthographic projections of the light shading parts 104 on the base substrate 101 and the shapes of the orthographic projections of the photosensitive devices 103 on the base substrate 101 are square.

Figure 3:
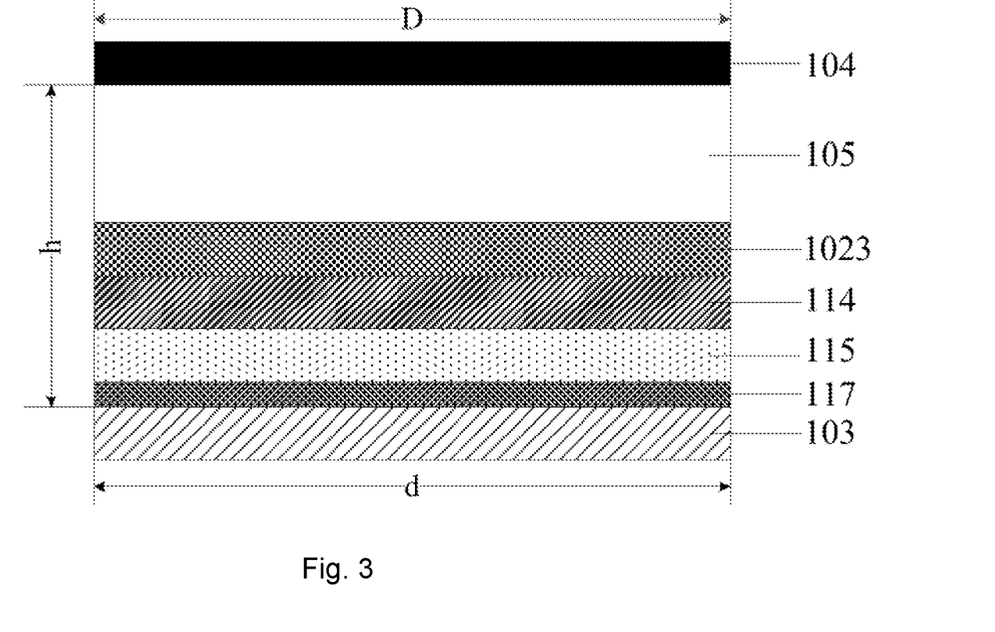
FIG. 3 is a spatial position schematic diagram of a photosensitive device and a light shading part according to an embodiment of the present disclosure.
Figure 4:
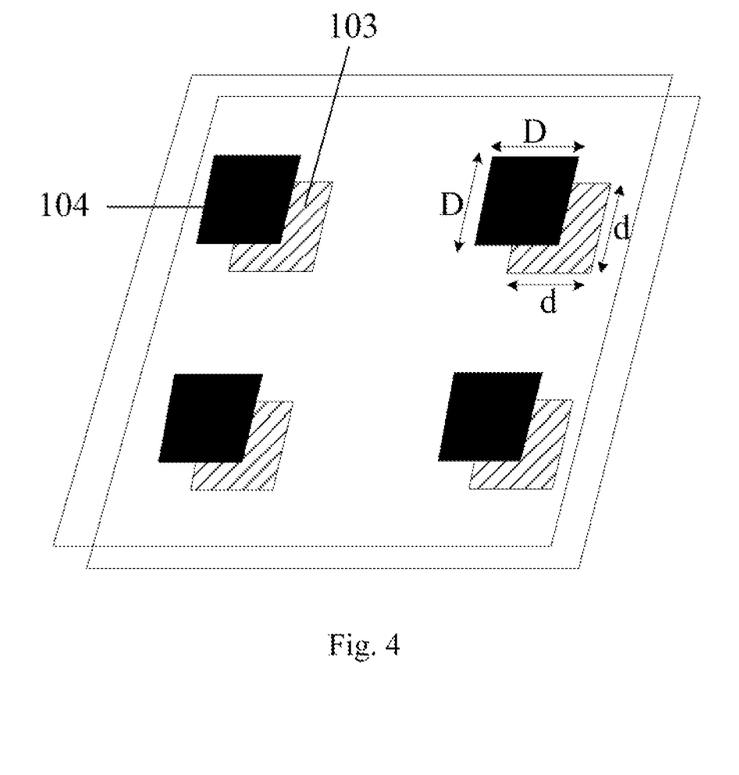
FIG. 4 is another spatial position schematic diagram of a photosensitive device and a light shading part according to an embodiment of the present disclosure.
Figure 5:
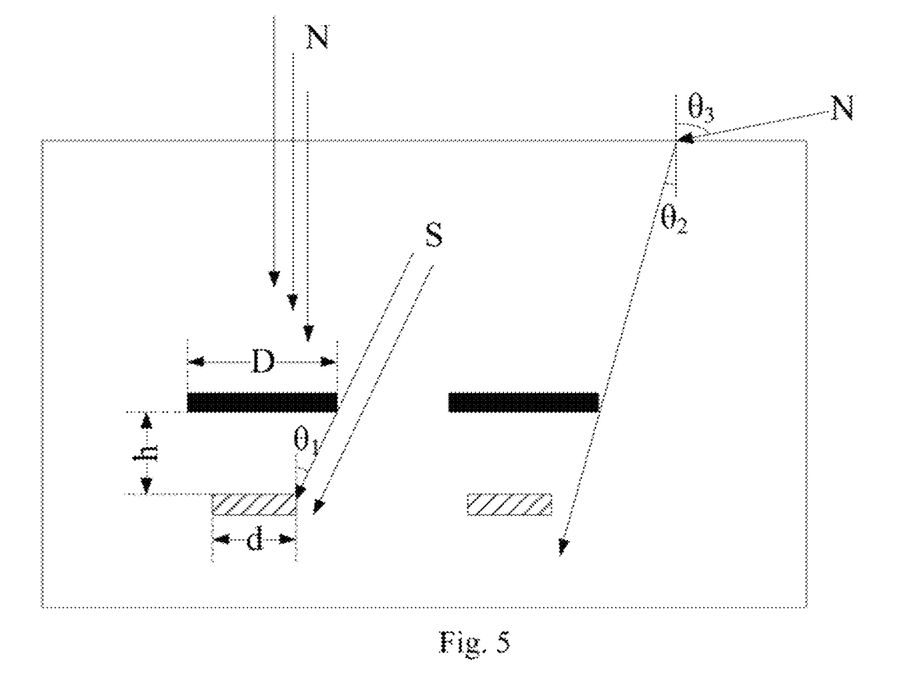
FIG. 5 is a schematic diagram of a design principle of a size relationship between a photosensitive device and a light shading part according to an embodiment of the present disclosure.

Light rays with an angle of corresponding returning light rays being between $\theta_1$ and $\theta_2$ in the light rays emitted by the point light source can finally be irradiated to the photosensitive devices 103, the maximum light ray angle that external ambient light can enter an OLED is $\theta_3$, h is the distance between the layer where the light shading parts 104 are disposed and the layer where the photosensitive devices 103 are disposed, the shapes of the photosensitive devices 103 are squares with a side length being d, and the shapes of the light shading parts 104 are squares with a side length being D, as shown in FIGS. 3 to 5. They should theoretically satisfy the following relationship: $D=d+2h*\tan(\theta_1-\theta_2)$. The value range of the capability value h is designed to be 6 μm-14 μm according to the process thickness, and the size range of d is generally designed as: 10 μm≤d≤20 μm; in addition, it is well known to those skilled in the art that the effective imaging range of the point light source is 42°-70°, and accordingly $\theta_1$ is 40°, and $\theta_2$ is 35°. From an equation (1), the size range of D can be solved as: 20 μm≤D≤40 μm.

Figure 6:
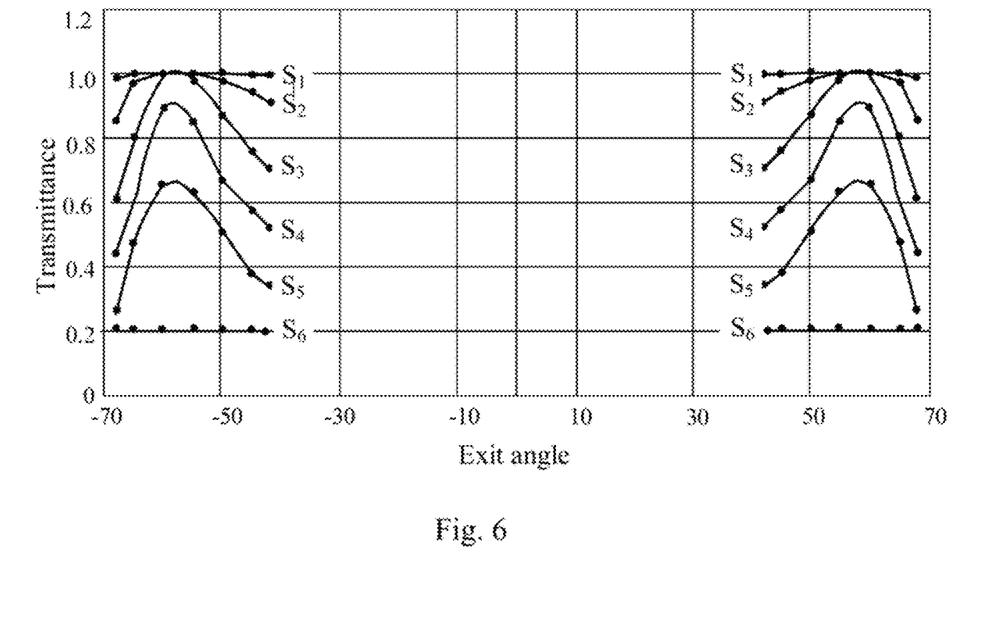
FIG. 6 is a graph of transmittance of signal light according to an embodiment of the present disclosure.
Figure 7:
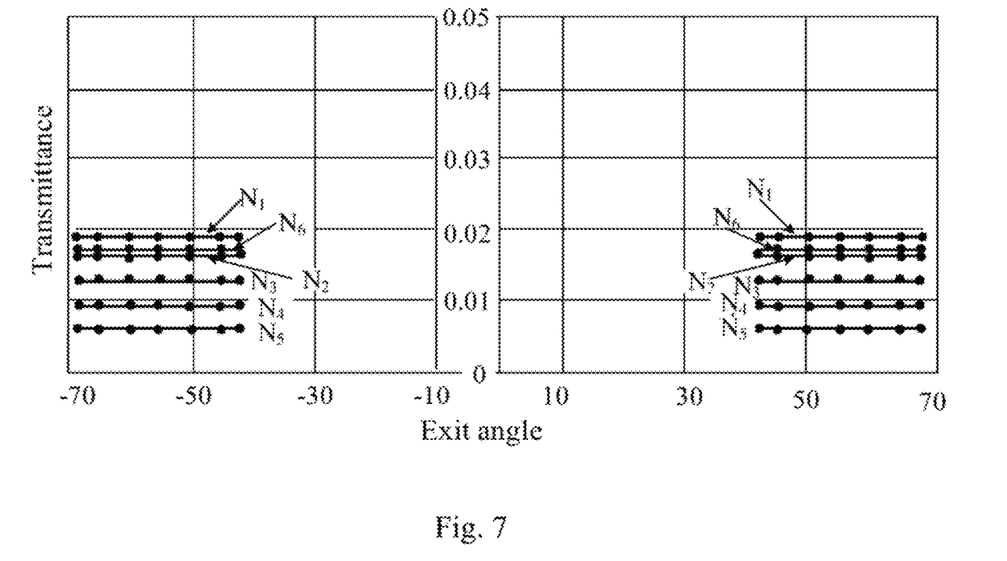
FIG. 7 is a graph of transmittance of external ambient light according to an embodiment of the present disclosure.
Figure 8:
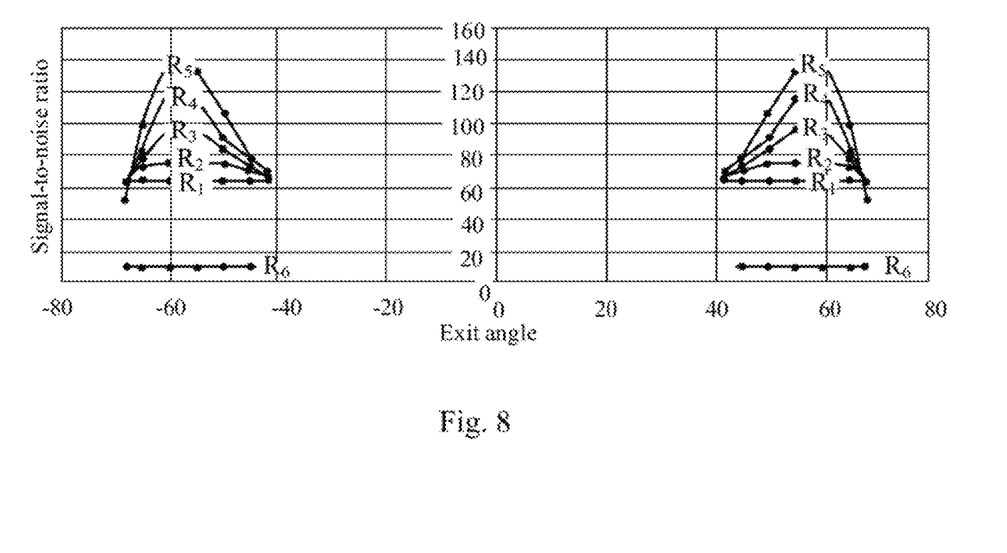
FIG. 8 is a graph of a signal-to-noise ratio according to an embodiment of the present disclosure.

According to the performance of the photosensitive devices 103 and an optical signal-to-noise ratio of the fingerprint to be satisfied, the size relationship between the light shading parts 104 and the photosensitive devices 103 will be further optimized. Optionally, considering the transmittance of the signal light when displayed, the light shading parts 104 need to be smaller than the photosensitive devices 103 when actually manufactured, according to the present disclosure, light efficiency evaluation is performed with respect to the design of FIG. 5, the shading conditions of a signal light and the ambient light are studied respectively, and the value correspondence relationship of d and D is optimized. FIG. 6 shows the transmittance when the signal light sequentially passes through each layer above a light emitting layer to the finger, then is reflected by the finger and then sequentially passes through each film layer above the photosensitive devices 103 to be irradiated to the photosensitive devices 103 when d is fixed at 18 μm and D is different values respectively. Optionally, D is 6 μm, 12 μm, 18 μm, 24 μm and 30 respectively corresponding to $S_1$, $S_2$, $S_3$, $S_4$ and $S_5$. $S_6$ represents a comparative example when d is 18 μm and the light shading parts 104 are absent. FIG. 7 shows the transmittance when the external ambient light sequentially passes through the film layers above the photosensitive devices 103 to be irradiated to the photosensitive devices 103 when d is fixed at 18 μm and D is different values respectively. Optionally, D is 6 μm, 12 μm, 18 μm, 24 μm and 30 μm respectively corresponding to $N_1$, $N_2$, $N_3$, $N_4$ and $N_5$. $N_6$ represents a comparative example when d is 18 μm and the light shading parts 104 are absent. FIG. 8 shows the signal-to-noise ratio when d is fixed at 18 μm and D is different values respectively. Optionally, D is 6 μm, 12 μm, 18 μm, 24 μm and 30 μm respectively corresponding to $R_1$, $R_2$, $R_3$, $R_4$ and $R_5$. $R_6$ represents a comparative example when d is 18 μm and the light shading parts 104 are absent. As can be obtained by referring to FIGS. 6 to 8, in order to ensure that the optical signal-to-noise ratio has a relatively large value within the effective imaging range)(42°-70° of the point light source, an optimum value of the light shading parts 104 is 12 μm, that is, the side length D of the light shading parts 104 is preferably about ⅓ smaller than the side length d of the photosensitive devices 103, and accordingly, an area ($D^2$) of the light shading parts 104 is preferably about ⅑ smaller than an area ($d^2$) of the photosensitive devices 103. That is, in order to improve the signal-to-noise ratio and obtain a better fingerprint recognition effect, when the shapes of the orthographic projections of the light shading parts 104 on the base substrate 101 are similar to those of the corresponding photosensitive devices 103 on the base substrate 101 and shape centers coincide with each other, the side length of the orthographic projections of the light shading parts 104 on the base substrate 101 needs to be about ⅓ smaller than that of the orthographic projections of the corresponding photosensitive devices 103 on the base substrate 101, for example greater than 0 and less than or equal to ½, preferably ⅓.

It should be noted that in the present disclosure, the shapes of the orthographic projections of the light shading parts 104 on the base substrate 101 are similar to the shapes of the orthographic projections of the photosensitive devices 103 on the base substrate 101, meaning that: the shapes are the same or substantially the same.

Optionally, in the above-described display panel provided by some embodiments of the present disclosure, the photosensitive devices 103 are disposed between the layer where the light emitting devices 102 are disposed and the base substrate 101. Due to the arrangement, after the photosensitive devices 103 are manufactured on the base substrate 101, the light emitting devices 102 are manufactured by adopting a related technology, so that good compatibility with an existing manufacturing process is realized, and the manufacturing process is simple.

Figure 9:
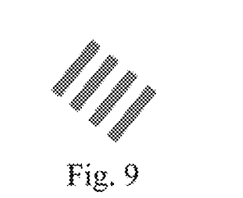
FIG. 9 is an objective image of a fingerprint.
Figure 10:
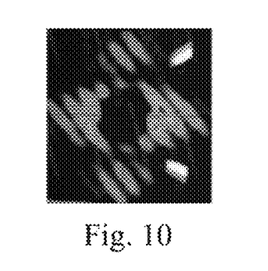
FIG. 10 is a fingerprint recognition image in the related art.

In the related art, the base substrate 101 is provided with a plurality of fingerprint recognition regions arranged in an array, but the photosensitive devices in each fingerprint recognition region are distributed unevenly, resulting in uneven final fingerprint imaging. FIG. 9 is a fingerprint, and FIG. 10 is a fingerprint recognition image of the related art, which shows that a fingerprint recognition effect is poor in comparison.

Figure 11:
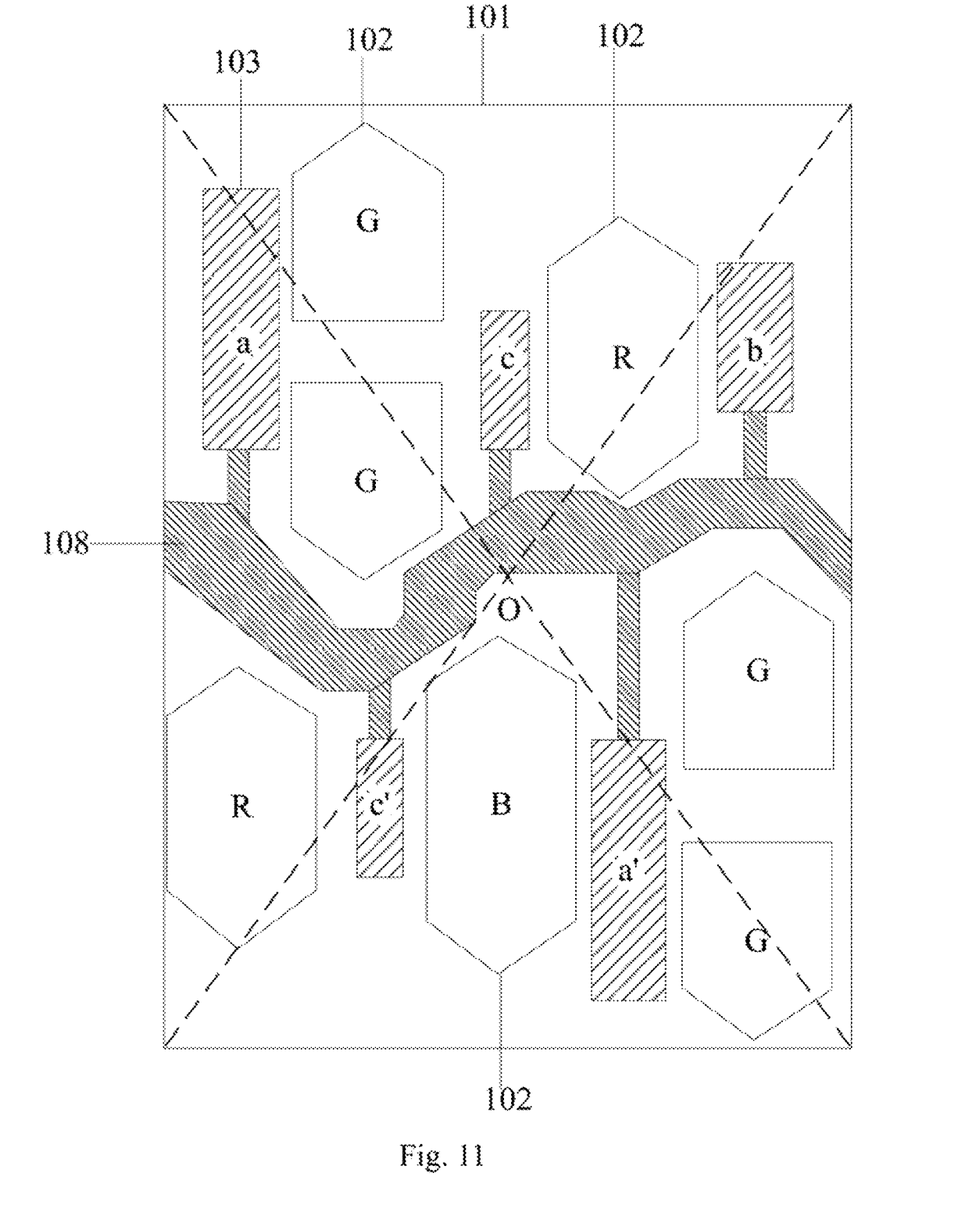
FIG. 11 is a plane structural schematic diagram of a fingerprint recognition region according to an embodiment of the present disclosure.
Figure 12:
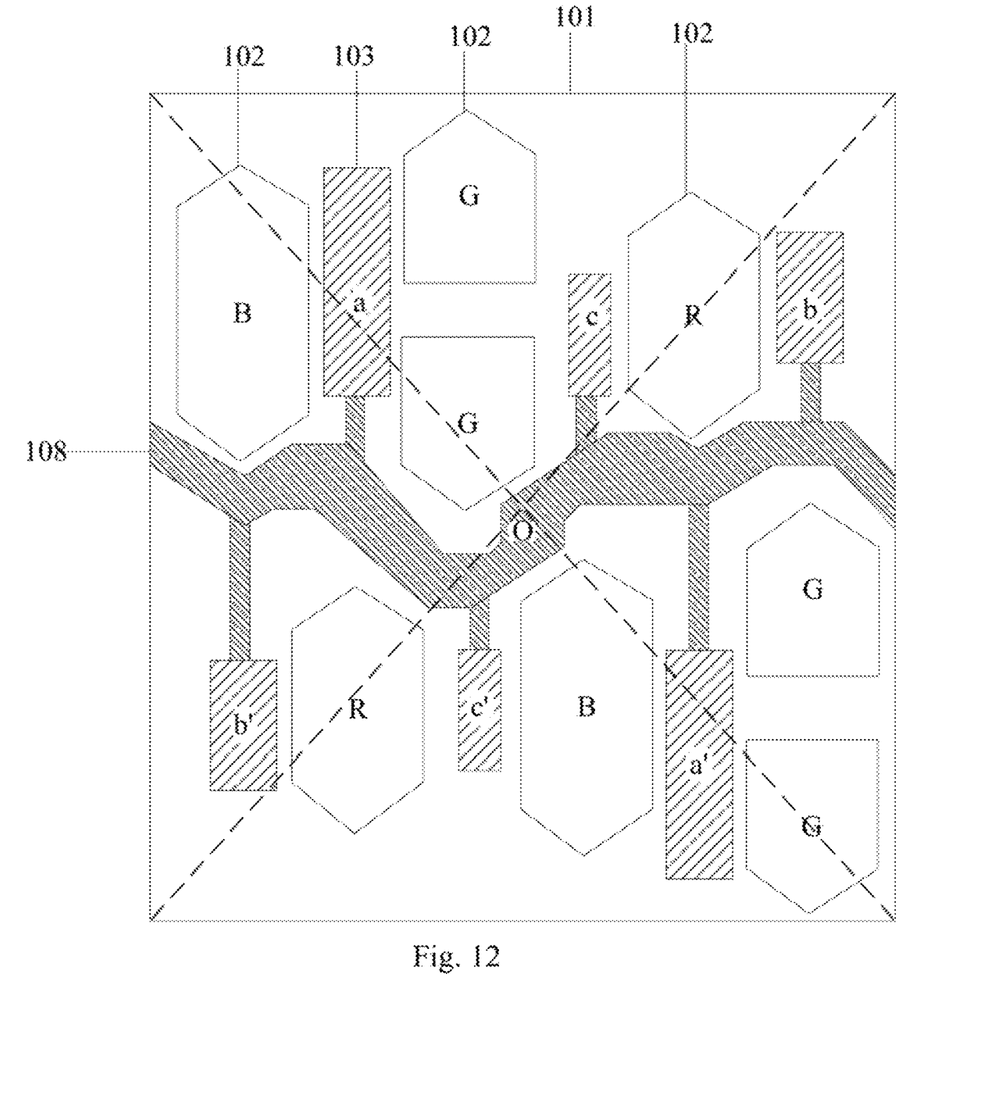
FIG. 12 is another plane structural schematic diagram of a fingerprint recognition region according to an embodiment of the present disclosure.
Figure 13:
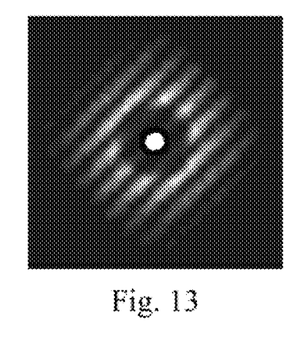
FIG. 13 is a fingerprint recognition image according to an embodiment of the present disclosure.

Based on the above, in the above-described display panel provided by the embodiment of the present disclosure, as shown in FIG. 11 and FIG. 12, one fingerprint recognition region at least includes two photosensitive devices 103, and the photosensitive devices 103 in each fingerprint recognition region are rotationally symmetrically arranged with respect to a center O of the fingerprint recognition region, so that the photosensitive devices 103 are uniformly distributed in each fingerprint recognition region, thereby realizing accurate fingerprint recognition, as shown in FIG. 13. FIG. 11 shows a condition that five photosensitive devices 103 are included in one fingerprint recognition region, and FIG. 12 shows a condition that six photosensitive devices 103 are included in one fingerprint recognition region. Of course, other numbers of photosensitive devices 103, such as four, eight, may also be included in one fingerprint recognition region when embodied, which are not specifically limited herein.

Optionally, in the above-described display panel provided by the embodiment of the present disclosure, the uniform design of the photosensitive devices 103 in the same fingerprint recognition region can be realized in two following ways.

One implementation is shown in FIG. 11, the numbers of the photosensitive devices 103 in rows are different in the same fingerprint recognition region (FIG. 11 schematically shows two rows of photosensitive devices 103, wherein one row includes three photosensitive devices 103 and the other row includes two photosensitive devices 103), and a sum of the lengths of all the photosensitive devices 103 is twice a sum of the widths thereof, that is, $2*(L_{AK}+L_{CK}+L_{BK}+L_{A'K}+L_{C'K})=L_{AL}+L_{CL}+L_{BL}+L_{A'L}+L_{C'L}$, wherein $L_{AK}$ and $L_{AL}$ are the width and length of the photosensitive device 103 represented by a, $L_{BK}$ and $L_{BL}$ are the width and length of the photosensitive device 103 represented by b, $L_{CK}$ and $L_{CL}$ are the width and length of the photosensitive device 103 represented by c, $L_{A'K}$ and $L_{A'L}$ are the width and length of the photosensitive device 103 represented by a', and $L_{C'K}$ and $L_{C'L}$ are the width and length of the photosensitive device 103 represented by c', respectively.

The other implementation is shown in FIG. 12, the numbers of the photosensitive devices 103 in rows are the same in the same fingerprint recognition region (FIG. 12 schematically shows two rows of photosensitive devices 103, and each row includes three photosensitive devices 103), and the shapes of every two photosensitive devices 103 symmetrical with respect to the center O of the fingerprint recognition region are the same. As shown in FIG. 12, the position of the photosensitive device 103 represented by a and the position of the photosensitive device 103 represented by a' are symmetrical with respect to the center O of the fingerprint recognition region, so the shape of the photosensitive device 103 represented by a and the shape of the photosensitive device 103 represented by a' are the same; the position of the photosensitive device 103 represented by b and the position of the photosensitive device 103 represented by b' are symmetrical with respect to the center O of the fingerprint recognition region, so the shape of the photosensitive device 103 represented by b and the shape of the photosensitive device 103 represented by b' are the same; and the position of the photosensitive device 103 represented by c and the position of the photosensitive device 103 represented by c' are symmetrical with respect to the center O of the fingerprint recognition region, so the shape of the photosensitive device 103 represented by c and the shape of the photosensitive device 103 represented by c' are the same. It should be noted that "the same in shape" in the present disclosure means the same area and the same size. In addition, the shapes of the photosensitive devices 103 are exemplarily given in FIG. 12 as rectangular, and they may be other shapes such as square when embodied, which is not specifically limited.

Optionally, in the above-described display panel provided by an embodiment of the present disclosure, as shown in FIG. 2, the display panel further includes: an encapsulation layer 105 disposed between the layer where the light emitting devices 102 are disposed and the layer where the light shading parts 104 are disposed.

By disposing the light shading parts 104 on the encapsulation layer 105, equivalent to adding a process to manufacture the light shading parts 104 after completing each film layer from the base substrate 101 to the encapsulation layer 105 by using the related art, good compatibility with the existing manufacturing process is thus achieved.

Optionally, in the above-described display panel provided by an embodiment of the present disclosure, as shown in FIG. 2, the display panel further includes: a touch electrode layer 106 disposed on one side, facing away from the base substrate 101, of the layer where the light shading parts 104 are disposed, so that the integration of a touch control function and a display function is realized. Optionally, the touch electrode layer 106 and the layer where the light shading parts 104 are disposed can be attached through first optical glue 107. In particular implementations, the touch electrode layer 106 may be a self-capacitance electrode layer or a mutual capacitance electrode layer, which is not specifically limited herein.

Figure 14:
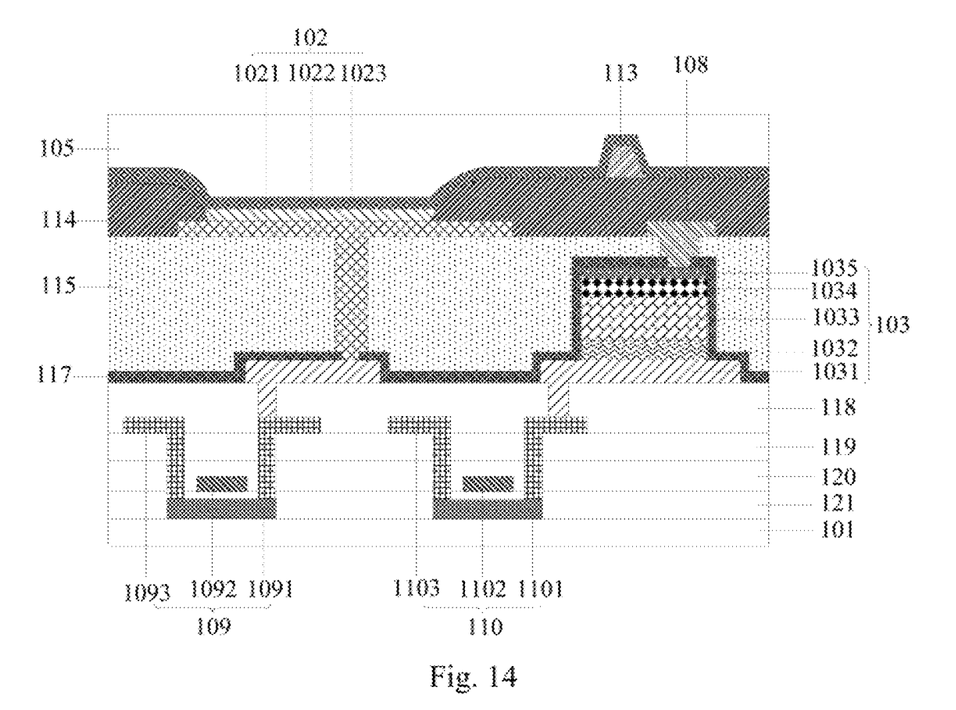
FIG. 14 is a sectional structural schematic diagram of a display panel according to an embodiment of the present disclosure.

Optionally, in the above-described display panel provided by an embodiment of the present disclosure, as shown in FIG. 2 and FIG. 14, the light emitting devices 102 include anodes 1021, and the display panel further includes: a plurality of bias lines 108 disposed on the same layer as the anodes 1021; and each bias line 108 is correspondingly and electrically connected with the photosensitive devices 103 contained in the corresponding row of the fingerprint recognition regions.

It should be noted that in the present disclosure, "the same layer" refers to a layer structure formed by obtaining film layers configured to form a specific pattern by using the same film forming process through the same material, and then performing a one-time patterning process using the same mask plate. That is, the one-time patterning process corresponds to one mask (also called a photomask). Depending on different particular patterns, the one-time patterning process may include multiple exposure, development, or etching processes, while the particular pattern in the formed layer structure may or may not be continuous, which may also be at different heights or have different thicknesses. Based on this, as the bias lines 108 are disposed on the same layer as the anodes, the manufacturing process is simplified. In addition, the bias lines 108 are configured to load bias on the photosensitive devices 103 in the fingerprint recognition process.

Optionally, in the above-described display panel provided by an embodiment of the present disclosure, as shown in FIG. 14, the display panel further includes: a plurality of first transistors 109 and a plurality of second transistors 110 disposed between the base substrate 101 and the layer where the photosensitive devices 103 are disposed; and each first transistor 109 is electrically connected with the corresponding light emitting device 102 in a one-to-one correspondence mode to realize independent driving of the corresponding light emitting device 102; each second transistor 110 is electrically connected with the corresponding photosensitive device 103 in a one-to-one correspondence mode to realize the addressing reading of electrical signals of the corresponding photosensitive device 103; and each film layer of each first transistor 109 and the same film layer of the corresponding second transistor 110 are disposed on the same layer, so that the manufacturing process is simplified. Optionally, an active layer 1091 of each first transistor 109 is disposed on the same layer as an active layer 1101 of the corresponding second transistor 110, a gate 1092 of each first transistor 109 is disposed on the same layer as a gate 1102 of the corresponding second transistor 110, and a source-drain electrode 1093 of each first transistor 109 is disposed on the same layer as a source-drain electrode 1103 of the corresponding second transistor 110.

In general, in the above-described display panel provided by an embodiment of the present disclosure, as shown in FIG. 2 and FIG. 14, the display panel may also include: a protective cover plate 111, second optical glue 112, a spacer 113, a pixel defining layer (MCC-PDL) 114 with a function of blocking ambient light, a flat layer 115, a buffer layer 116, a sidewall protection layer 117, an insulating layer 119, an interlayer dielectric layer 119, a first gate insulating layer 120 and a second gate insulating layer 121. Each light emitting device 102 generally includes: the anode 1021, a light emitting functional layer 1022 (at least including a hole injection layer, a hole transmission layer, an electron blocking layer, an organic electroluminescent layer or quantum dot light emitting layer, a hole blocking layer, an electron transport layer and an electron injection layer), and a cathode 1023. In the case where each photosensitive device 103 is a PIN type photodiode, the photosensitive device 103 may include: a bottom electrode 1031, a P-type semiconductor layer 1032, an intrinsic semiconductor layer 1033, an N-type semiconductor layer 1034, and a top electrode 1035, wherein each bias line 108 is electrically connected to the corresponding top electrode 1035 through a via of the corresponding flat layer 115. As can be seen in combination with FIGS. 2, 3, and 14, the distance h between the layer where the light shading parts 104 are disposed and the layer where the photosensitive devices 103 are disposed is a sum of thicknesses of the sidewall protection layer 117, the flat layer 115, the pixel defining layer 114, the cathode 1023, and the encapsulation layer 105.

Based on the same inventive concept, an embodiment of the present disclosure also provides display equipment, including the above-described display panel provided by the embodiment of the present disclosure. The display equipment may be any product or component with a display function, such as a mobile phone, a tablet computer, a television, a display, a notebook computer, a digital photo frame, a navigator, an intelligent watch, a body-building wrist strap, a personal digital assistant and the like. Other essential components of the display equipment will be apparent to those of ordinary skill in the art and are not described in detail herein, nor should they be construed as limiting the present disclosure. In addition, since the principle of solving the problem by the display equipment is similar to the principle of solving the problem by the above-described display panel, the implementation of the display equipment can be referred to the embodiment of the above-described display panel, and repeated description thereof will be omitted.

The display panel and the display equipment provided by the embodiment of the present disclosure each include the base substrate; the plurality of light emitting devices disposed on the base substrate; the plurality of photosensitive devices disposed on the base substrate, the orthographic projection of each photosensitive device on the base substrate being disposed at the gap of the orthographic projections of the adjacent light emitting devices on the base substrate; and the plurality of light shading parts disposed on the side, facing away from the base substrate, of the layer where the light emitting devices are disposed, wherein the light shading parts are in one-to-one correspondence with the photosensitive devices, and the orthographic projections of the light shading parts on the base substrate are at least partially overlapped with the orthographic projections of the corresponding photosensitive devices on the base substrate. The light shading parts at least partially overlapped with the photosensitive devices are disposed to shade the external ambient light, so that the ambient light is prevented from being irradiated to the photosensitive devices to a certain extent, most of light received by the photosensitive devices is the signal light, the influence of the ambient light on the signal light is effectively avoided, and the optical signal-to-noise ratio is improved.

It will be apparent to those of ordinary skill in the art that various modifications and variations can be made in the disclosed embodiments without departing from the spirit or scope of the embodiments of the present disclosure. Thus, it is intended that the present disclosure covers the modifications and variations provided they come within the scope of the appended

What is claimed is:

1. A display panel, comprising:
   a base substrate;
   a plurality of light emitting devices disposed on the base substrate;
   a plurality of photosensitive devices disposed on the base substrate, wherein an orthographic projection of each photosensitive device on the base substrate is disposed at a gap of orthographic projections of adjacent light emitting devices on the base substrate; and
   a plurality of light shading parts disposed on a side, facing away from the base substrate, of the light emitting devices, wherein the light shading parts are in one-to-one correspondence with the photosensitive devices, and orthographic projections of the light shading parts on the base substrate are at least partially overlapped with orthographic projections of corresponding photosensitive devices on the base substrate;
   wherein an entire orthographic projection of each of the light shading parts on the base substrate is disposed within an orthographic projection of a corresponding photosensitive device on the base substrate;
   wherein the base substrate comprises a plurality of fingerprint recognition regions disposed in an array; and
   each of the fingerprint recognition region comprises at least two photosensitive devices, and the photosensitive devices in each of the fingerprint recognition regions are rotationally symmetrically distributed relative to a center of the fingerprint recognition regions where the photosensitive devices are disposed;
   wherein a shape of the orthographic projections of the light shading parts on the base substrate is similar to a shape of the orthographic projections of the corresponding photosensitive devices on the base substrate, and centers of shapes coincide with each other;
   wherein the shape of the orthographic projections of the light shading parts on the base substrate is rectangular, and a length of each side of the orthographic projections of the light shading parts on the base substrate is less than or equal to ½ of a side length of the orthographic projections of the corresponding photosensitive devices on the base substrate.

2. The display panel according to claim 1, wherein the side length of the orthographic projections of the light shading parts on the base substrate is equal to ⅓ of the side length of the orthographic projections of the corresponding photosensitive devices on the base substrate.

3. The display panel according to claim 2, wherein the shape of the orthographic projections of the photosensitive devices on the base substrate is square, and a side length of the square is greater than or equal to 10 µm and less than or equal to 20 µm.

4. The display panel according to claim 1, wherein the photosensitive devices are disposed between the layer where the light emitting devices are disposed and the base substrate.

5. The display panel according to claim 1, wherein numbers of the photosensitive devices in rows are different within a same fingerprint recognition region, and a sum of lengths of the photosensitive devices is twice a sum of widths of the photosensitive devices.

6. The display panel according to claim 1, wherein numbers of the photosensitive devices in rows are same within a same fingerprint recognition region, and shapes of every two photosensitive devices symmetrical with respect to the center of the fingerprint recognition region are the same.

7. The display panel according to claim 1, further comprising: an encapsulation layer disposed between the layer where the light emitting devices are disposed and a layer where the light shading parts are disposed.

8. The display panel according to claim 1, further comprising: a touch electrode layer disposed on a side, facing away from the base substrate, of a layer where the light shading parts are disposed.

9. The display panel according to claim 1, wherein the light emitting devices comprise anodes, and the display panel further comprises: a plurality of bias lines disposed on a same layer as the anodes; and
   each bias line is correspondingly and electrically connected with the photosensitive devices contained in corresponding row of the fingerprint recognition regions.

10. The display panel according to claim 1, further comprising: a plurality of first transistors and a plurality of second transistors disposed between the base substrate and a layer where the photosensitive devices are disposed; and
    the first transistors are electrically connected with corresponding light emitting devices in a one-to-one correspondence manner, the second transistors are electrically connected with corresponding photosensitive devices in a one-to-one correspondence manner, and film layers of the first transistors and film layers of the corresponding second transistors are disposed on same layers.

11. A display equipment, comprising the display panel according to claim 1.

* * * * *

UNITED STATES PATENT AND TRADEMARK OFFICE
CERTIFICATE OF CORRECTION

| | | |
|---|---|---|
| PATENT NO. | : 11,895,898 B2 | Page 1 of 1 |
| APPLICATION NO. | : 17/264143 | |
| DATED | : February 6, 2024 | |
| INVENTOR(S) | : Xiaoquan Hai | |

It is certified that error appears in the above-identified patent and that said Letters Patent is hereby corrected as shown below:

On the Title Page

Item [30], Delete the foreign application number in it's entirety and substitute therefor
-- PCT/CN2020/087170 --.

Signed and Sealed this
Ninth Day of April, 2024

Katherine Kelly Vidal
Director of the United States Patent and Trademark Office